(12) United States Patent
Choi et al.

(10) Patent No.: US 9,875,990 B2
(45) Date of Patent: Jan. 23, 2018

(54) SEMICONDUCTOR PACKAGE INCLUDING PLANAR STACKED SEMICONDUCTOR CHIPS

(71) Applicant: SK hynix Inc., Icheon-si Gyeonggi-do (KR)

(72) Inventors: Hyung Ju Choi, Seoul (KR); Ki Yong Lee, Seoul (KR); Jong Hyun Kim, Seoul (KR); Hyoung Min Im, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/994,235

(22) Filed: Jan. 13, 2016

(65) Prior Publication Data

US 2017/0040291 A1  Feb. 9, 2017

(30) Foreign Application Priority Data

Aug. 3, 2015  (KR) .......................... 10-2015-0109314

(51) Int. Cl.
| | |
|---|---|
| *H01L 23/48* | (2006.01) |
| *H01L 25/065* | (2006.01) |
| *H01L 23/00* | (2006.01) |
| *H01L 23/31* | (2006.01) |

(52) U.S. Cl.
CPC .......... *H01L 25/0655* (2013.01); *H01L 24/09* (2013.01); *H01L 24/49* (2013.01); *H01L 23/3128* (2013.01); *H01L 2224/04042* (2013.01); *H01L 2924/00014* (2013.01)

(58) Field of Classification Search
CPC . H01L 25/0753; H01L 25/0655; H01L 24/49; H01L 24/09; H01L 23/3114; H01L 2224/04042

See application file for complete search history.

(56) References Cited

U.S. PATENT DOCUMENTS

| | | | |
|---|---|---|---|
| 2002/0149102 A1* | 10/2002 | Hashemi ............. | H01L 23/3677 257/706 |
| 2008/0113471 A1* | 5/2008 | Kelly ................... | H01L 25/0655 438/107 |
| 2008/0179726 A1* | 7/2008 | Sung .................... | H01L 23/3128 257/685 |

(Continued)

FOREIGN PATENT DOCUMENTS

| | | |
|---|---|---|
| KR | 1020080010993 A | 1/2008 |
| KR | 1020130090173 A | 8/2013 |

*Primary Examiner* — A. Sefer
(74) *Attorney, Agent, or Firm* — William Park & Associates Ltd.

(57) ABSTRACT

A semiconductor package may be provided. A semiconductor package may include a substrate. The semiconductor package may include a first semiconductor chip and a second semiconductor chip which are disposed adjacent to each other over a first surface of the substrate. The semiconductor package may include first bonding wires which electrically couple the first semiconductor chip and the substrate. The semiconductor package may include an insulation adhesive which is interposed between the second semiconductor chip and the substrate. The first bonding wires may be disposed to pass through the insulation adhesive and electrically couple the first semiconductor chip and the substrate.

20 Claims, 8 Drawing Sheets

(56) References Cited

U.S. PATENT DOCUMENTS

| | | | |
|---|---|---|---|
| 2011/0253429 A1* | 10/2011 | Humphries | H05K 3/282 174/255 |
| 2012/0052628 A1* | 3/2012 | Kuroda | H01L 24/32 438/107 |
| 2013/0033825 A1* | 2/2013 | Brooks | H05K 3/284 361/748 |

* cited by examiner

SEMICONDUCTOR PACKAGE INCLUDING PLANAR STACKED SEMICONDUCTOR CHIPS

CROSS-REFERENCES TO RELATED APPLICATION

The present application claims priority under 35 U.S.C. § 119(a) to Korean Patent Application No. 10-2015-0109314 filed on Aug. 3, 2015, in the Korean Intellectual Property Office, which is incorporated herein by reference in its entirety.

BACKGROUND

1. Technical Field

Various embodiments generally relate to a semiconductor package, and more particularly, to a semiconductor package which is configured in such a way that two or more semiconductor chips are stacked in a planar manner.

2. Related Art

As electronic products are gradually downsized and highly functionalized, semiconductor chips with higher capacities are needed to satisfy desired functions. Thus, it is necessary to mount an increased number of semiconductor chips on a small-sized electronic product. Technologies for manufacturing semiconductor chips with high capacity or mounting an increased number of semiconductor packages in a limited space have its limitations. Therefore, the recent trend in technology development is directed at embedding an increased number of semiconductor chips in one package.

Thus, as a result, semiconductor packages are being developed to try and provide one or more semiconductor chips having high capacities and multiple functions while maintaining the overall size of the semiconductor package.

SUMMARY

In an embodiment, a semiconductor package may include a substrate. The semiconductor package may include a first semiconductor chip and a second semiconductor chip disposed adjacent to each other over a first surface of the substrate. The semiconductor package may include first bonding wires electrically coupling the first semiconductor chip and the substrate. The semiconductor package may include an insulation adhesive interposed between the second semiconductor chip and the substrate. The first bonding wires may be disposed to pass through the insulation adhesive.

In an embodiment, a semiconductor package may include a substrate a first semiconductor chip, a second semiconductor chip, an insulation adhesive, and a plurality of first bonding wires. The substrate may include a first surface having a first region and a second region formed side by side at positions spaced apart from each other. The substrate may include a plurality of bond fingers arranged over the first surface at a position adjacent to an edge of the second region that is close to the first region. The substrate may include a first solder resist formed over the first surface and having a first open region exposing the first bond fingers and portions of the first surface that are between the first bond fingers. The first semiconductor chip may be disposed over the first region of the first surface of the substrate, and having a lower surface facing the first surface of the substrate, an upper surface facing away from the lower surface, and a plurality of first bonding pads arranged adjacent to an edge of the upper surface that is adjacent to the first bond fingers. The second semiconductor chip may be disposed over the second region of the first surface of the substrate, and having a lower surface facing the first surface of the substrate, and an upper surface facing away from the lower surface. The insulation adhesive may be interposed between the substrate and the second semiconductor chip. The plurality of first bonding wires may be formed to pass through the insulation adhesive and may electrically couple the first bond fingers of the substrate and the first bonding pads of the first semiconductor chip.

In an embodiment, a semiconductor package may include a substrate. The semiconductor package may include a first semiconductor chip disposed adjacent to a second semiconductor chip over a first surface of the substrate. The semiconductor package may include a plurality of bond fingers arranged over the first surface of the substrate adjacent to an edge of the second semiconductor chip closest to the first semiconductor chip. The semiconductor package may include a first solder resist formed over the first surface of the substrate and having a first open region exposing the first bond fingers. The semiconductor package may include first bonding wires electrically coupling the first semiconductor chip and the substrate. The first bonding wires may pass through the first open region.

In an embodiment, an electronic system may include a semiconductor package, a controller, an interface, an input/output unit and a memory device which are coupled to a bus. The controller and the memory device may include a semiconductor package. The semiconductor package may include a substrate, a first semiconductor chip and a second semiconductor chip disposed side by side over a first surface of the substrate, first bonding wires electrically coupling the first semiconductor chip and the substrate, and an insulation adhesive interposed between the second semiconductor chip and the substrate. The first bonding wires may be disposed to pass through the insulation adhesive.

In an embodiment, a memory card including a semiconductor package may include a memory including the semiconductor package and a memory controller for controlling the memory. The semiconductor package may include a substrate, a first semiconductor chip and a second semiconductor chip disposed side by side over a first surface of the substrate, first bonding wires electrically coupling the first semiconductor chip and the substrate, and an insulation adhesive interposed between the second semiconductor chip and the substrate. The first bonding wires may be disposed to pass through the insulation adhesive.

DETAILED DESCRIPTION

Figure 1:
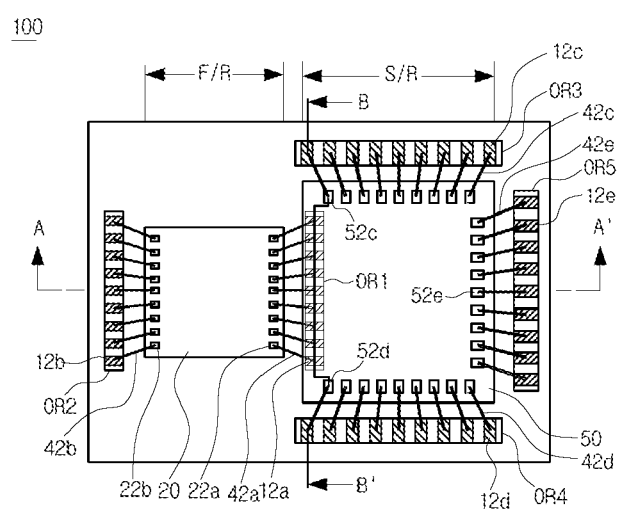
FIG. 1 is a plan view illustrating a representation of an example of a semiconductor package, from which an encapsulation member has been removed, in accordance with an embodiment.

Hereinafter, various embodiments will be described below with reference to the accompanying drawings. The various embodiments relate to a semiconductor package. In the drawings, the shapes and sizes of components may be exaggerated for the sake of clear description, and the same reference numerals are used to designate the same or similar components.

Figure 2:
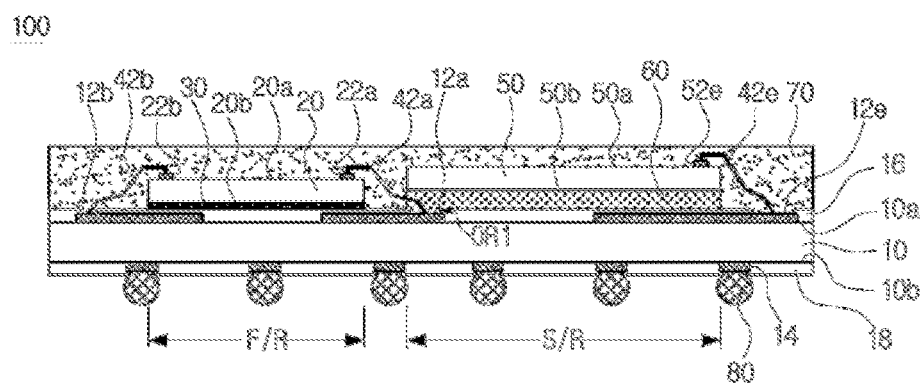
FIG. 2 is a sectional view taken along line A-A' of FIG. 1.
Figure 3:
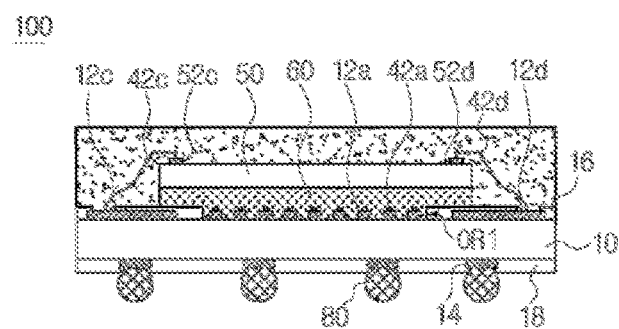
FIG. 3 is a sectional view taken along line B-B' of FIG. 1.

Referring to FIGS. 1 to 3, a semiconductor package 100 in accordance with an embodiment may include a substrate 10, at least two semiconductor chips, e.g., first and second semiconductor chips 20 and 50, bonding wires 42a, 42b, 42c, 42d, and 42e, and an insulation adhesive 60. The semiconductor package 100 in accordance with an embodiment may further include an adhesive member 30, an encapsulation member 70, and an external connection member 80.

The substrate 10 may be a printed circuit board. The substrate 10 may have an approximately rectangular plate shape when viewed from the plan view. The substrate 10 may have a first surface 10a which refers to an upper surface, and a second surface 10b which faces away from the first surface 10a and refers to a lower surface. The substrate 10 may include a first region F/R on which the first semiconductor chip 20 is disposed, and a second region S/R which is spaced apart from the first region F/R and on which the second semiconductor chip 50 is disposed. The second region S/R may include a region for arrangement of first bond fingers 12a which are electrically coupled to the first semiconductor chip 20.

The substrate 10 may include a plurality of bond fingers 12a, 12b, 12c, 12d, and 12e which are arranged on the first surface 10a, and a plurality of ball lands 14 which are arranged on the second surface 10b. The first bond fingers 12a may be arranged adjacent to an edge of the second region S/R that is close to the first region F/R. The second bond fingers 12b may be further arranged on the first surface 10a for electrical coupling between the first semiconductor chip 20 and the substrate 10. In an embodiment, the second bond fingers 12b may be arranged adjacent to an edge of the substrate 10 that faces away from the second region S/R.

For electrical coupling between the second semiconductor chip 50 and the substrate 10, bond fingers may be further arranged on the perimeter of the second region S/R. In an embodiment, the third to fifth bond fingers 12c, 12d, and 12e are arranged on the perimeter of the second region S/R. For example, the third and fourth bond fingers 12c and 12d may be arranged adjacent to respective edges of the second region S/R that are perpendicular or substantially perpendicular to the edge of the second region S/R along which the first bond fingers 12a are arranged. The fifth bond fingers 12e may be arranged adjacent to an edge of the second region S/R facing away from the first region F/R.

Although the third to fifth bond fingers 12c, 12d, and 12e are illustrated as being arranged on respective three edges around the second region S/R in an embodiment, the embodiments are not limited to this. In other embodiments, only at least one group of bonding fingers among the third to fifth bond fingers 12, 12d, and 12e may be arranged.

Although not illustrated, the substrate 10 may include circuit patterns which are respectively formed on the first and second surfaces 10a and 10b, and via patterns which are formed inside the substrate 10. The first to fifth bond fingers 12a, 12b, 12c, 12d, and 12e and the ball lands 14 may be ends of circuit patterns. The first to fifth bond fingers 12a, 12b, 12c, 12d, and 12e and the ball lands 14 may be electrically coupled to each other by the circuit patterns and the via patterns.

The substrate 10 may include a first solder resist 16 and a second solder resist 18 which are respectively formed on the first surface 10a and the second surface 10b such that the first to fifth bond fingers 12a, 12b, 12c, 12d, and 12e and the ball lands 14 are exposed. The first solder resist 16 may have a first open region OR1 exposing the first bond fingers 12a, outer portions of the outermost first bond fingers 12a, and portions of the first surface 10a that are between the first bond fingers 12a.

Figure 4:
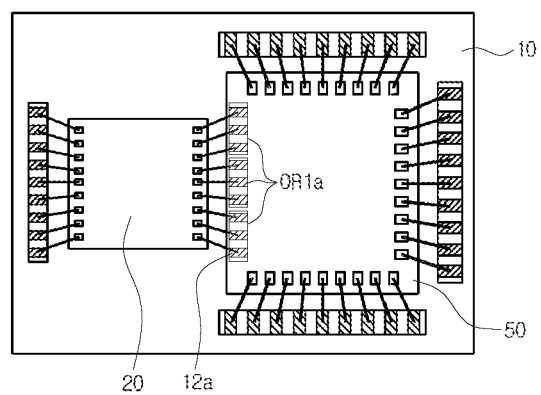
FIGS. 4 to 6 are plan views illustrating representations of examples of a first open region of a semiconductor package in accordance with embodiments.
Figure 5:
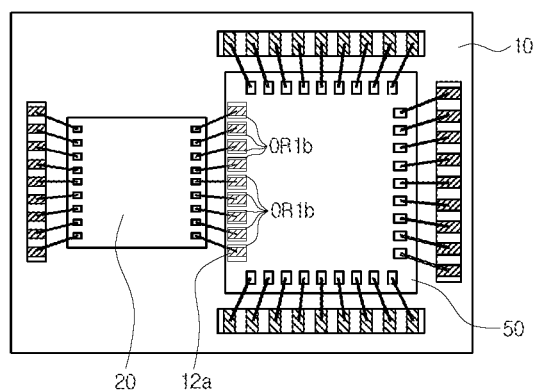

In an embodiment, the single first open region OR1 may be formed in a form to expose all of the first bond fingers 12a. Alternatively, referring to FIG. 4, each of a plurality of first open regions OR1a may be formed in a way to expose a predetermined number of ones of the first bond fingers 12a. As a further alternative, referring to FIG. 5, first open regions OR1b the number of which corresponds to the number of first bond fingers 12a may be formed to individually expose the respective first bond fingers 12a.

Figure 6:
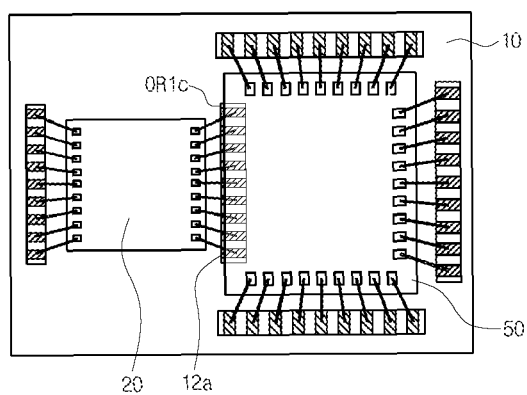

In an embodiment, the first open region OR1 may be formed to be disposed inside the second region S/R. In other words, the first open region OR1 may be covered with the second semiconductor chip 50. Alternatively, referring to FIG. 6, a first open region OR1c may be formed over the second region S/R and an outer region adjacent to the second region S/R. Thus, a portion of the first open region OR1c can be exposed from the second semiconductor chip 50.

The first solder resist 16 may further have second to fifth open regions OR2, OR3, OR4, and OR5 exposing the second to fifth bond fingers 12b, 12c, 12d, and 12e. In an embodiment, second to fifth open regions OR2, OR3, OR4, and OR5 may each comprise a single open region and be formed in shapes that respectively allow all of the second bond fingers 12b, all of the third bond fingers 12c, all of the fourth fingers 12d, and all of the fifth bond fingers 12e to be exposed.

Referring again to FIGS. 1 to 3, the first semiconductor chip 20 may be a memory chip or logic chip and have a shape approximately corresponding to that of the first region F/R. The first semiconductor chip 20 may have an upper surface 20a, and a lower surface 20b facing away from the upper surface 20a. The first semiconductor chip 20 may include a plurality of first bonding pads 22a which are arranged adjacent to an edge of the upper surface 20a that is close to the second region S/R of the substrate 10. The first semiconductor chip 20 may further include a plurality of second bonding pads 22b which are arranged adjacent to another edge of the upper surface 20a that is close to the second bond fingers 12b. The first semiconductor chip 20 may be disposed on the first region F/R of the substrate 10 such that the lower surface 20b thereof faces the first surface 10a of the substrate 10. The first semiconductor chip 20 may be bonded to the substrate 10 by the adhesive member 30.

The adhesive member 30 may function to attach the first semiconductor chip 20 to the first surface 10a of the substrate 10. The adhesive member 30 may include an adhesive film or adhesive paste.

The first and second bonding wires 42a and 42b may be formed to electrically couple the substrate 10 and the first semiconductor chip 20. For example, the first bonding wires 42a may be formed to electrically couple the first bond fingers 12a of the substrate 10 and the first bonding pads 22a of the first semiconductor chip 20. The second bonding wires 42b may be formed to electrically couple the second bond fingers 12b of the substrate 10 and the second bonding pads 22b of the first semiconductor chip 20. Particularly, the first bonding wires 42a may be disposed to pass through the insulation adhesive 60, which will be explained later herein, in the second region S/R of the substrate 10 and coupled to the first bond fingers 12a via the first open region OR1 of the first solder resist 16.

The second semiconductor chip 50 may be a memory chip or logic chip and have a shape approximately corresponding to that of the second region S/R. The second semiconductor chip 50 may have an upper surface 50a, and a lower surface 50b facing away from the upper surface 50a. The second semiconductor chip may be disposed adjacent to the first semiconductor chip 20 over the first surface 10a of the substrate 10. The second semiconductor chip 50 may be stacked to be coplanar with the first semiconductor chip 20 on the first surface 10a of the substrate 10. For example, the second semiconductor chip 50 may be disposed at a position horizontally spaced apart from the first semiconductor chip 20 on the substantially same plane as a plane on which the first semiconductor chip 20 is disposed. The lower surface 50b of the second semiconductor chip 50 may face the first surface 10a of the substrate 10. The second semiconductor chip 50 may be bonded on the second region S/R of the substrate 10 by the insulation adhesive 60.

The second semiconductor chip 50 may include third to fifth bonding pads 52c, 52d, and 52e which are arranged on the upper surface 50a. To avoid interference with the first bonding wires 42a, the third to fifth bonding pads 52c, 52d, and 52e may not be disposed adjacent to an edge of the second semiconductor chip 50 that faces the first region F/R. In other words, the third to fifth bonding pads 52c, 52d, and 52e may be arranged adjacent to an edge of the second semiconductor chip 50 that faces away from the first region F/R and adjacent to edges of the second semiconductor chip 50 that are perpendicular or substantially perpendicular to the edge facing away from the first region F/R. In an embodiment, the third and fourth bonding pads 52c and 52d may be arranged adjacent to the edges of the second semiconductor chip 50 that are respectively close to the third and fourth bond fingers 12c and 12d of the substrate 10. The fifth bonding pads 52e may be arranged adjacent to the edge of the second semiconductor chip 50 that is close to the fifth bond fingers 12e.

The insulation adhesive 60 may include a penetrate wafer backside lamination (PWBL) film allowing wires to pass therethrough. The insulation adhesive 60 such as a PWBL film may cover the first bond fingers 12a and portions of the first bonding wires 42a coupled to the first bond fingers 12a and attach the second semiconductor chip 50 to the first surface 10a of the substrate 10. The insulation adhesive 60 may be filled to the first open region OR1 of the first solder resist 16. As the insulation adhesive 60 covers portions of the first bonding wires 42a coupled to the first bond fingers 12a, the first bonding wires 42a may be coupled to the first bond fingers 12 through the insulation adhesive 60.

The third to fifth bonding wires 42c, 42d, and 42e may be formed to respectively pass through a third open region OR3, a fourth open region OR4, and a fifth open region OR5, thus respectively electrically coupling the third to fifth bond fingers 12c, 12d, and 12e of the substrate 10 and the third to fifth bonding pads of the second semiconductor chip 50.

The encapsulation member 70 may be formed to protect the first and second semiconductor chips 20 and 50 from the outside. The encapsulation member 70 may include an epoxy molding compound. The encapsulation member 70 may be formed on the first surface 10a of the substrate 10 to cover the first and second semiconductor chips 20 and 50 and the first to fifth bonding wires 42a, 42b, 42c, 42d, and 42e.

The external connection member 80 may be a means for mounting the semiconductor package 100 in accordance with an embodiment to an external circuit. The external connection member 80 may include a solder ball. The external connection member 80 may be formed on each of the ball lands 14 that are exposed from the second solder resist 18 on the second surface 10b of the substrate 10. For example, the external connection member 80 made of a solder ball may be formed in such a way that flux is dotted on each of the ball lands 16 of the substrate 10, a solder ball is attached to each ball land 14 dotted with flux, and then a reflow process for the attached solder balls is conducted. Alternatively, the external connection member 80 may include solder paste, a conductive pin, a conductive spring or the like.

As described above, the substrate 10 may include the first bond fingers 12a disposed on the first surface 10a. The first semiconductor chip 20 and the second semiconductor chip 50 may be disposed side by side on the first surface 10a of the substrate 10. The first semiconductor chip 50 is disposed in such a way that it overlaps the first bond fingers 12a. The second semiconductor chip 50 is bonded to the substrate 10 by the insulation adhesive 60 such as a PWBL film. The second semiconductor chip 50 may be disposed to cover the first bond fingers 12a and thus prevent the first bond fingers 12a from being exposed. Each of the first and second semiconductor chips 20 and 50 may have a rectangular shape. The first and second semiconductor chips 20 and 50 are disposed such that one side of the first semiconductor chip 20 faces one side of the second conductor chip 50. The first bonding pads 22a are disposed adjacent to the edge of the first semiconductor chip 20 that is close to the second semiconductor chip 50.

The first bonding wires 42a are disposed for electrical coupling between the substrate 10 and the first semiconductor chip 20. A first end of each of the first bonding wires 42a is connected to the corresponding first bond finger 12a, and a second end thereof is connected to the corresponding first bonding pad 22a. For example, the first bonding wires 42a pass both through space between the first semiconductor chip 20 and the second semiconductor chip 50 and through the first open region OR1 of the first solder resist 16 and connect the respective first bond fingers 12a and the corresponding first bonding pads 22a.

The insulation adhesive 60 such as a PWBL film is disposed to cover substantially all of the first bonding wires 42a disposed between the second semiconductor chip 50 and the substrate 10. The first open region OR1 of the first solder resist 16 may be filled with the insulation adhesive 60. In an embodiment, the insulation adhesive 60 may be disposed such that the first open region OR1 is substantially completely filled with the insulation adhesive 60. In the case where the first open region OR1 is substantially completely filled with the insulation adhesive 60, a problem of a reduction of reliability attributable to a void (e.g., a problem of delamination between the insulation adhesive 60 and the substrate 10) can be effectively restricted, avoided, or reduced.

The semiconductor package 100 in accordance with an embodiment may be configured such that the second semiconductor chip 50 including the insulation adhesive 60 is disposed to cover the first bond fingers 12a of the substrate 10 and the first bonding wires 42a that are connected to the first bond fingers 12a. Therefore, in the semiconductor package 100 in accordance with an embodiment, the required area of the package can be reduced compared to that in the configuration in which all of the first bond fingers 12a are exposed from the first surface 10a of the substrate 10. Generally, when bond fingers for wire bonding are disposed between chips, there may be the need for a predetermined space between the chips and the bond fingers to allow a capillary used for wire bonding to form a wire loop. In accordance with the present embodiments, there may be no need for a separate space to be defined between the second semiconductor chip 50 and the first bond fingers 12a. Thus, the size of the semiconductor package 100 in accordance with the embodiments can be reduced compared to that in the configuration in which the first and second semiconductor chips 20 and 50 and the bond fingers are disposed on the substrate 10 at positions spaced apart from each other.

Figure 7:
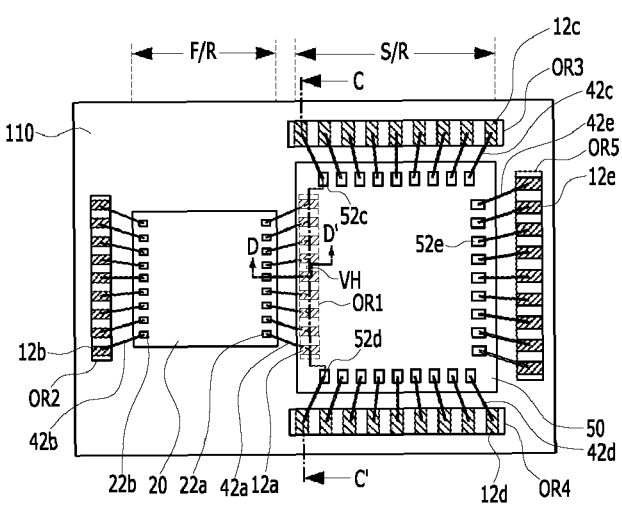
FIG. 7 is a plan view illustrating a representation of an example of a semiconductor package, from which an encapsulation member has been removed, in accordance with an embodiment.
Figure 8:
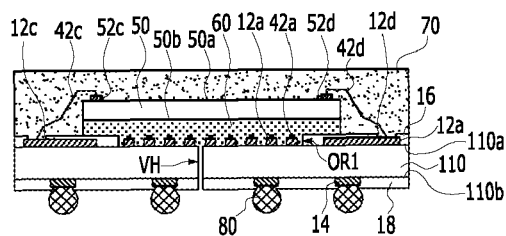
FIG. 8 is a sectional view taken along line C-C' of FIG. 7.

Referring to FIGS. 7 to 8, a semiconductor package 200 in accordance with an embodiment may include a substrate 110, at least two semiconductor chips (e.g., first and second semiconductor chips 20 and 50), bonding wires 42a, 42b, 42c, 42d, and 42e, and an insulation adhesive 60. The semiconductor package 200 in accordance with an embodiment may further include an adhesive member (not illustrated) and an encapsulation member 70. The semiconductor package 200 in accordance with an embodiment may further include an external connection member 80.

The substrate 110 may have a first surface 110a and a second surface 110b facing away from the first surface 110a. The substrate 110 may include a first region F/R on which the first semiconductor chip 20 is disposed, and a second region S/R which is spaced apart from the first region F/R and on which first bond fingers 12a and the second semiconductor chip 50 are disposed.

The substrate 110 may include a plurality of first to fifth bond fingers 12a, 12b, 12c, 12d, and 12e which are arranged on the first surface 110a, and a plurality of ball lands 14 which are arranged on the second surface 110b. The first and second bond fingers 12a and 12b may be provided for electrical coupling to the first semiconductor chip 20. The first bond fingers 12a may be arranged adjacent to an edge of the second region S/R that is close to the first region F/R. The second bond fingers 12b may be arranged adjacent to an edge of the first region F/R that faces away from the second region S/R. The third and fifth bond fingers 12c, 12d, and 12e may be provided for electrical coupling to the second semiconductor chip 50. The third and fourth bond fingers 12c and 12d may be arranged adjacent to respective edges of the second region S/R that are perpendicular to the edge of the second region S/R along which the first bond fingers 12a are arranged. The fifth bond fingers 12e may be arranged adjacent to an edge of the second region S/R that faces away from the first region F/R.

Although the bonding fingers are illustrated as being arranged adjacent to all of the three edges along the perimeter of the second region S/R in the present embodiment, only at least one group of bonding fingers among the third to fifth bonding fingers 12c, 12d, and 12e may be provided as an alternative.

The substrate 110 may include circuit patterns which are formed on each of the first and second surfaces 110a and 110b, and via patterns which are formed inside the substrate 110. The first to fifth bond fingers 12a, 12b, 12c, 12d, and 12e and the ball lands 14 may be electrically coupled to each other by the circuit patterns and the via patterns.

The substrate 110 may include a first solder resist 16 which is formed on the first surface 110a such that the first to fifth bond fingers 12a, 12b, 12c, 12d, and 12e are exposed, and a second solder resist 18 which is formed on the second surface 110b such that the ball lands 14 are exposed. Particularly, the first solder resist 16 may have a first open region OR1 which exposes the first bond fingers 12a, outer portions of the outermost first bond fingers 12a, and portions of the first surface 110a that are between the first bond fingers 12a. The second solder resist 18 may be formed such that a vent hole VH, which will be explained later herein, is exposed.

Figure 10:
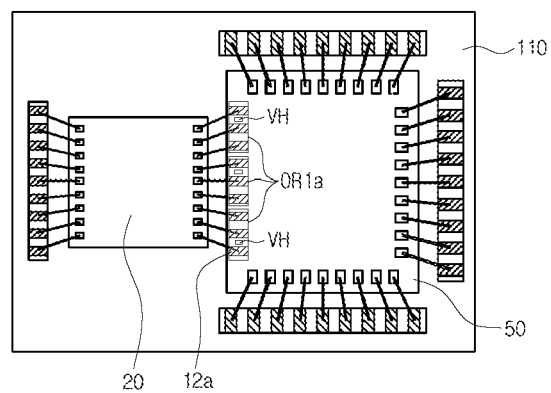

The single first open region OR1 may be formed to expose all of the first bond fingers 12a. Alternatively, referring to FIG. 10, a plurality of first open regions OR1a each may be formed in a form to expose a predetermined number of ones of the first bond fingers 12a. As a further alternative, although not illustrated, first open regions OR1 the number of which corresponds to the number of first bond fingers 12a may be formed to individually expose the respective first bond fingers 12a.

Figure 11:
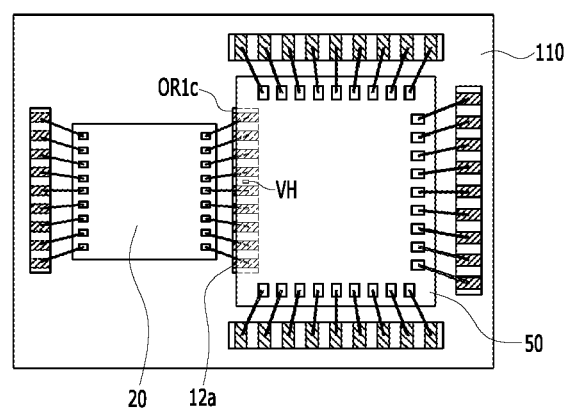

The first open region OR1 may be disposed in the second region S/R such that the first open region OR1 is covered with the second semiconductor chip 50. Alternatively, referring to FIG. 11, a first open region OR1c may be formed over the second region S/R and an outer region adjacent to the second region S/R so that a portion of the first open region OR1c can be exposed from the second semiconductor chip 50.

Figure 9:
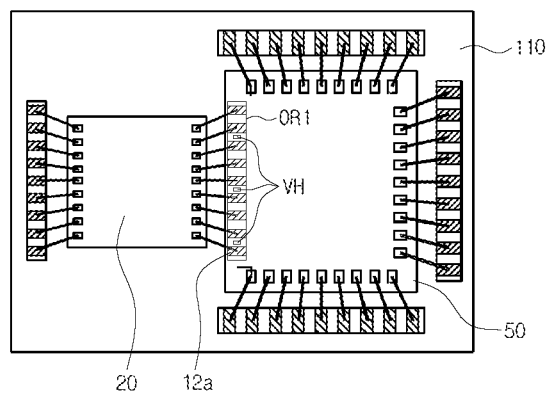
FIGS. 9 to 11 are plan views illustrating representations of examples of a first open region and a vent hole of a semiconductor package in accordance with embodiments.

The substrate 110 may have the vent hole VH which is formed in the first open region OR1 of the first solder resist 16 such that it passes through the first and second surfaces 110a and 110b. The position, at which the vent hole VH is disposed, and the number thereof may be changed depending on the shape of the first open region OR1. For instance, a single vent hole VH may be formed in a single first open region OR1 which is formed such that all of the first bond fingers 12a are exposed through the first open region OR1. Alternatively, referring to FIG. 9, a plurality of vent holes VH may be formed in a single first open region OR1 which is formed such that all of the first bond fingers 12a are exposed through the first open region OR1. As a further alternative, referring to FIG. 10, at least one vent hole VH may be formed in each of a plurality of first open region OR1a, each of which is formed in a form to expose a predetermined number of first bond fingers 12a. Although not illustrated, a single vent hole VH may be formed in each of first open regions OR1, the number of which corresponds to the number of first bonding pads 22a, and each of which is formed in a form to individually expose a corresponding one of the first bond fingers 12a.

The vent hole VH may be formed to prevent failure caused by void formed in the first open region OR1. For example, the first open region OR1 is covered with the insulation adhesive 60 during a process of attaching the second semiconductor chip 60 to the substrate 110. Here, the first open region OR1 must be completely filled with the insulation adhesive 60, but it may be only partially filled with the insulation adhesive 60, whereby void may be formed. In this case, popcorn failure may be caused by moisture absorption, or ion migration may be caused by absorbed moisture, whereby an electrical path may be formed, thus causing failure such as a short circuit. In the semiconductor package 200 in accordance with an embodiment, air can flow out through at least one vent hole VH formed in the first open region OR1 of the substrate 110, whereby formation of void can be prevented. Consequently, failure resulting from void can be prevented.

The first solder resist 16 may further have second to fifth open regions OR2, OR3, OR4, and OR5 which expose the second to fifth bond fingers 12*b*, 12*c*, 12*d*, and 12*e*. In an embodiment, second to fifth open regions OR2, OR3, OR4, and OR5 may be formed in shapes that respectively allow all of the second bond fingers 12*b*, all of the third bond fingers 12*c*, all of the fourth fingers 12*d*, and all of the fifth bond fingers 12*e* to be exposed.

Referring again to FIGS. 7 and 8, the first semiconductor chip 20 may include an upper surface and a lower surface facing away from the upper surface. The first semiconductor chip 20 may include a plurality of first bonding pads 22*a* which are arranged adjacent to an edge of the upper surface of the substrate 110 that is close to the second region S/R. The first semiconductor chip 20 may further include a plurality of second bonding pads 22*b* which are arranged adjacent to another edge of the upper surface of the substrate 110 that is close to the second bond fingers 12*b*. The first semiconductor chip 20 may be disposed on the first region F/R of the substrate 110 such that the lower surface thereof faces the first surface 110*a* of the substrate 110. The first semiconductor chip 20 may be bonded to the substrate 110 by an adhesive member (not illustrated).

The adhesive member may function to attach the first semiconductor chip 20 to the first surface 110*a* of the substrate 110. The adhesive member may include an adhesive film or adhesive paste.

The first bonding wires 42*a* may be formed to electrically couple the first bond fingers 12*a* of the substrate 110 and the first bonding pads 22*a* of the first semiconductor chip 20. Particularly, the first bonding wires 42*a* may be connected to the first bond fingers 12*a* via the first open region OR1 of the first solder resist 16 in the second region S/R of the substrate 110. The second bonding wires 42*b* may be formed to electrically couple the second bond fingers 12*b* of the substrate 110 and the second bonding pads 22*b* of the first semiconductor chip 20.

The second semiconductor chip 50 may have an upper surface 50*a*, and a lower surface 50*b* facing away from the upper surface 50*a*. The second semiconductor chip 50 may be stacked, to be coplanar with the first semiconductor chip 20, on the first surface 110*a* of the substrate 110. The second semiconductor chip 50 may be bonded on the second region S/R of the substrate 110 by the insulation adhesive 60 such that the lower surface 50*b* of the second semiconductor chip 50 faces the first surface 110*a* of the substrate 110. The second semiconductor chip 50 may cover both the first bond fingers 12*a* arranged on the second region S/R and portions of the first bonding wires 42*a* that are connected to the first bond fingers 12*a*.

The second semiconductor chip 50 may include third to fifth bonding pads 52*c*, 52*d*, and 52*e* which are arranged on the upper surface 50*a*. In an embodiment, the third and fourth bonding pads 52*c* and 52*d* may be arranged adjacent to the edges of the second semiconductor chip 50 that are respectively close to the third and fourth bond fingers 12*c* and 12*d* of the substrate 110. The fifth bonding pads 52*e* may be arranged adjacent to the edge of the second semiconductor chip 50 that is close to the fifth bond fingers 12*e*.

The insulation adhesive 60 may include a PWBL film allowing wires to pass therethrough. The insulation adhesive 60 such as a PWBL film may cover the first bond fingers 12*a* and portions of the first bonding wires 42*a* that are connected to the first bond fingers 12*a*. The insulation adhesive 60 such as a PWBL film may attach the second semiconductor chip 50 to the first surface 110*a* of the substrate 110. The insulation adhesive 60 may be filled to the first open region OR1 of the first solder resist 16.

As described above, when the second semiconductor chip 50 is bonded on the second region S/R of the substrate 110 by the insulation adhesive 60, portion of the first open region OR1 may not be filled with the insulation adhesive 60, thus causing a void. Thereby, failure attributable to the void may be caused.

Figure 12:
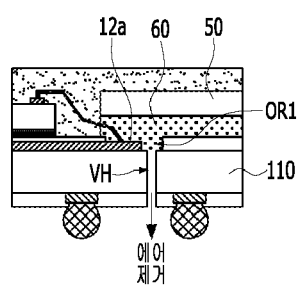
FIG. 12 is a sectional view taken along line D-D' of FIG. 7.

Referring to FIG. 12, in an embodiment, when the second semiconductor chip 50 is bonded to the substrate 110 by an adhesive film 60, air can be removed through the vent hole VH. Thus, the first open region OR1 can be completely filled with the insulation adhesive 60 because air can be reliably removed from the first open region OR1, whereby void can be prevented from being formed in the first open region OR1. Therefore, the semiconductor package 200 in accordance with the embodiments can effectively prevent void form being formed in the first open region OR1, thus preventing failure from being caused by a void.

The third to fifth bonding wires 42*c*, 42*d*, and 42*e* may be formed to respectively electrically couple the third to fifth bonding pads 52*c*, 52*d*, and 52*e* of the second semiconductor chip 50 to the third, fourth, and fifth bond fingers 12*c*, 12*d*, and 12*e* of the substrate 110 that are arranged adjacent to the third to fifth bonding pads 52*c*, 52*d*, and 52*e*.

The encapsulation member 70 may be formed on the first surface 110*a* of the substrate 110 to cover the first and second semiconductor chips 20 and 50 and the first to fifth bonding wires 42*a*, 42*b*, 42*c*, 42*d*, and 42*e*. The encapsulation member 70 may include an epoxy molding compound.

The external connection member 80 may be formed on each of the ball lands 14 that are exposed from the second solder resist 18 on the second surface 110*b* of the substrate 110. The external connection member 80 may include a solder ball. Alternatively, the external connection member 80 may include solder paste, a conductive pin, a conductive spring or the like.

The above-described semiconductor packages may be applied to various kinds of semiconductor devices and package modules having the same.

Figure 13:
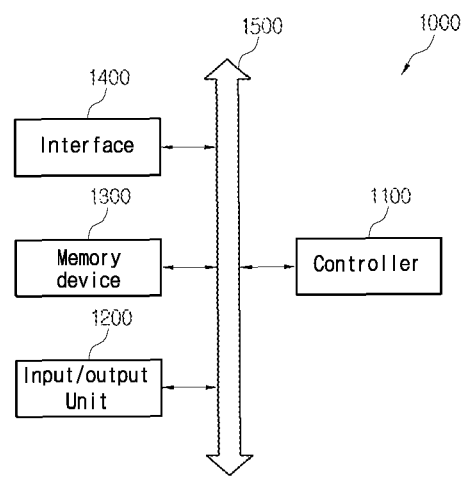
FIG. 13 is a block diagram representation of an example of an electronic system to which a semiconductor package in accordance with an embodiment is applied.

FIG. 13 is a block diagram representation of an example of an electronic system to which a semiconductor package in accordance with an embodiment is applied.

As referred to in the drawing, an electronic system 1000 may include a controller 1100, an input/output unit 1200, and a memory device 1300. The controller 1100, the input/output unit 1200, and the memory device 1300 may be electrically coupled with one another through a bus 1500 which provides data movement paths.

For example, the controller 1100 may include at least any one of a microprocessor, a digital signal processor, a microcontroller, and logic devices capable of performing similar functions to these components. The controller 1100 and the memory device 1300 may include a semiconductor package in accordance with each of various embodiments. The input/output unit 1200 may include at least one selected from among a keypad, a keyboard, a display device, and so forth.

The memory device 1300 may store data and/or commands to be executed by the controller 1100. The memory device 1300 may include a volatile memory device such as a DRAM and/or a nonvolatile memory device such as a flash memory. For example, a flash memory may be mounted to an information processing system such as a mobile terminal and a desktop computer. Such a flash memory may be configured by an SSD (solid state drive). In this case, the electronic system 1000 may reliably store a large amount of data in a flash memory system.

Such an electronic system 1000 may further include an interface 1400 for transmitting data to a communication network or receiving data from a communication network. The interface 1400 may be a wired or wireless type. For example, the interface 1400 may include an antenna or a wired/wireless transceiver.

Although not illustrated, the electronic system 1000 may further include an application chipset, a camera image processor, and so forth.

The electronic system 1000 may be realized as a mobile system, a personal computer, a computer for an industrial use, or a logic system which performs various functions. For example, the mobile system may be any one among a personal digital assistant (PDA), a portable computer, a web tablet, a mobile phone, a smart phone, a wireless phone, a laptop computer, a memory card, a digital music system and an information transmission/reception system.

In the case where the electronic system 1000 is equipment capable of performing wireless communication, the electronic system 1000 may be used in a communication system such as CDMA (code division multiple access), GSM (global system for mobile communication), NADC (North American digital cellular), E-TDMA (enhanced-time division multiple access), WCDMA (wideband code division multiple access), CDMA2000, LTE (long term evolution) and Wibro (wireless broadband Internet).

Figure 14:
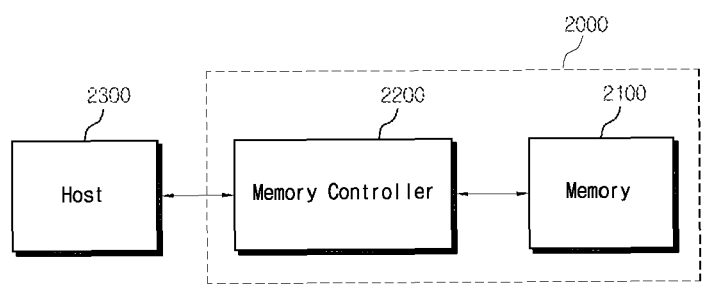
FIG. 14 is a block diagram representation of an example of a memory card including a semiconductor package in accordance with an embodiment.

FIG. 14 is a block diagram representation of an example of a memory card including the semiconductor package in accordance with various embodiments.

As referred to in the drawing, a stack package in accordance with various embodiments may be provided in the form of a memory card 2000. For instance, the memory card 2000 may include a memory 2100 such as a nonvolatile memory device and a memory controller 2200. The memory 2100 and the memory controller 2200 may store data or read stored data.

The memory 2100 may include at least any one among nonvolatile memory devices to which the semiconductor packages in accordance with the above-described various embodiments are applied. The memory controller 2200 may control the memory 2100 to read stored data or store data, in response to a read/write request from a host 2300.

What is claimed is:

1. A semiconductor package comprising:
   a substrate comprising:
   a first surface having a first region and a second region formed side by side at positions spaced apart from each other;
   a plurality of first bond fingers arranged over the first surface at a position adjacent to an edge of the second region that is close to the first region; and
   a first solder resist formed over the first surface and having a first open region exposing the first bond fingers and portions of the first surface that are between the first bond fingers;
   a first semiconductor chip disposed over the first region of the first surface of the substrate, and having a lower surface facing the first surface of the substrate, an upper surface facing away from the lower surface and a plurality of first bonding pads arranged adjacent to an edge of the upper surface that is adjacent to the first bond fingers;
   a second semiconductor chip disposed over the second region of the first surface of the substrate, and having a lower surface facing the first surface of the substrate and an upper surface facing away from the lower surface;
   an insulation adhesive interposed between the substrate and the second semiconductor chip; and
   a plurality of first bonding wires formed to penetrate through the insulation adhesive and electrically couple the first bond fingers of the substrate and the first bonding pads of the first semiconductor chip,
   wherein the insulation adhesive contacts with the portions of the first surface that are between the first bond fingers.

2. The semiconductor package according to claim 1, wherein the substrate further comprises a plurality of second bond fingers arranged adjacent to an edge of the first surface that faces away from the second region.

3. The semiconductor package according to claim 2, wherein the first semiconductor chip further comprises a plurality of second bonding pads arranged adjacent to another edge of the upper surface that is close to the second bond fingers.

4. The semiconductor package according to claim 3, further comprising a plurality of second bonding wires formed to electrically couple the second bond fingers of the substrate and the second bonding pads of the first semiconductor chip.

5. The semiconductor package according to claim 1, wherein the substrate further comprises at least one group of bond fingers among third bond fingers and fourth bond fingers arranged adjacent to respective edges of the second region that are substantially perpendicular to the edge of the second region along which the first bond fingers are arranged, and fifth bond fingers arranged adjacent to an edge of the second region facing away from the first region.

6. The semiconductor package according to claim 5, wherein the second semiconductor chip further comprises at least one group of bonding pads among third to fifth bonding pads arranged adjacent to edges of the upper surface of the second semiconductor chip that are respectively close to the third to fifth bond fingers.

7. The semiconductor package according to claim 6, further comprising a plurality of third to fifth bonding wires formed to respectively electrically couple the third to fifth bond fingers of the substrate and the third to fifth bonding pads of the second semiconductor chip.

8. The semiconductor package according to claim 1, wherein the first open region is formed to be disposed in the second region of the substrate.

9. The semiconductor package according to claim 1, wherein the first open region is formed to be disposed over the second region and an outer region adjacent to the second region.

10. The semiconductor package according to claim 1, wherein the first open region comprises a single first open region formed to expose all of the first bond fingers and the portions of the first surface that are between the first bond fingers.

11. The semiconductor package according to claim 1, wherein the first open region comprises a plurality of first open regions each formed to expose, in a group, a predetermined number of ones of the first bond fingers and portions of the first surface that are between the corresponding first bond fingers.

12. The semiconductor package according to claim 11, wherein the substrate has one vent hole for each group formed in the first open region for each group, the at least one vent hole formed to pass through the first surface and a second surface facing away from the first surface of the substrate.

13. The semiconductor package according to claim 1, wherein the first open region comprises a plurality of first open regions each formed to individually expose a corresponding one of the first bond fingers and a portion of the first surface that is adjacent to the corresponding first bond finger.

14. The semiconductor package according to claim 13, wherein the substrate further comprises a second solder resist formed over the second surface such that the vent hole is exposed.

15. The semiconductor package according to claim 1, wherein the substrate has at least one vent hole which is formed in the first open region to pass through the first surface and a second surface facing away from the first surface.

16. The semiconductor package according to claim 1, wherein the first open region is filled with the insulation adhesive.

17. The semiconductor package according to claim 16, wherein the insulation adhesive includes a PWBL (penetrate wafer backside lamination) film.

18. The semiconductor package according to claim 1, further comprising:
   an adhesion member interposed between the substrate and the first semiconductor chip; and
   an encapsulation member formed over the first surface of the substrate to cover the first and second semiconductor chips and the first bonding wires.

19. The semiconductor package according to claim 1, wherein the insulation adhesive contacts with the portions of the first surface that are between the first bond fingers and exposed in the first open region.

20. A semiconductor package comprising:
   a substrate comprising:
      a first surface having a first region and a second region formed side by side at positions spaced apart from each other;
      a plurality of first bond fingers disposed over the second region; and
      a first solder resist formed over the first surface and having a first open region exposing the first bond fingers and portions of the first surface that are between the first bond fingers;
   a first semiconductor chip disposed over the first region of the first surface of the substrate, and having a lower surface facing the first surface of the substrate, an upper surface facing away from the lower surface and a plurality of first bonding pads arranged adjacent to an edge of the upper surface that is adjacent to the first bond fingers;
   a second semiconductor chip disposed over the second region of the first surface of the substrate;
   an insulation adhesive interposed between the substrate and the second semiconductor chip; and
   a plurality of first bonding wires formed to penetrate through the insulation adhesive and electrically couple the first bond fingers and the first bonding pads,
   wherein the insulation adhesive contacts with the portions of the first surface that are between the first bond fingers, and
   wherein the first bond fingers arranged along an edge of the first region that is close the second region.

* * * * *